United States Patent [19]

Fournier

[11] Patent Number: 6,008,119
[45] Date of Patent: Dec. 28, 1999

[54] CHEMICAL-MECHANICAL POLISHING OF SEMICONDUCTOR WAFERS

[75] Inventor: Bernard Fournier, Bretigny-sur-Orge, France

[73] Assignee: International Business Machines Corporation, Armonk, N.Y.

[21] Appl. No.: 08/940,762

[22] Filed: Sep. 30, 1997

[30] Foreign Application Priority Data

Dec. 13, 1996 [EP] European Pat. Off. .............. 96480109

[51] Int. Cl.⁶ ................................................ H01L 21/4763
[52] U.S. Cl. .......................... 438/633; 438/638; 438/693; 438/747
[58] Field of Search ..................... 438/633, 638, 438/672, 693, 747, 754; 216/18, 38, 89; 134/17, 33, 34

[56] References Cited

U.S. PATENT DOCUMENTS 4,956,313  9/1990  Cote ........................................ 438/672
5,551,986  9/1996  Jain .............................................. 134/6
5,702,563  12/1997  Salugsugan ........................... 156/636.1
5,726,099  3/1998  Jaso ........................................ 438/693

FOREIGN PATENT DOCUMENTS

0710981A2  11/1994  European Pat. Off. .
0664559A2  7/1995  European Pat. Off. .

*Primary Examiner*—Charles Bowers
*Assistant Examiner*—Nema Berezny
*Attorney, Agent, or Firm*—Alison D. Mortinger; Jay H. Anderson

[57] ABSTRACT

A chemical mechanical polishing process in a wafer is polished with slurry under selected operating conditions for a first time period that avoids overpolishing; and then polished with DI water under the selected operating conditions for a second time period until the surface of the wafer is substantially planar and dishing is minimized. The process can be used in conjunction with a damascene or dual-damascene process in which tungsten is polished with respect to BPSG.

6 Claims, 4 Drawing Sheets

CHEMICAL-MECHANICAL POLISHING OF SEMICONDUCTOR WAFERS

FIELD OF INVENTION

The present invention relates to chemical-mechanical polishing (CMP) of semiconductor wafers, and more particularly to an improved method for planarizing topographical features to minimize dishing.

BACKGROUND OF THE INVENTION

A semiconductor chip is typically a silicon die which incorporates a number of active/passive devices interconnected by a pattern of metal wires to form the desired circuit. In VLSI (Very Large Scale Integration) chips, these metal patterns are multilayered and each layer of metal wires is separated from one another by a layer of an insulating material. Interlevel contacts between two planes of metal wires are made by metal studs filling via-holes which are etched through said insulating layer. Cost reduction and circuit performance increase continue to place considerable demand on the manufacturing process to add supplementary wiring levels. However, the above described via-hole based technique, although widely used today, has multiple limitations and drawbacks as the number of wiring levels increases. With three or four levels of wiring levels being the current state of the art, it is absolutely mandatory to planarize the wafer surface at least after the first level of metallization (M1) has been completed. As a matter of fact, to reduce surface topography related problems associated with a non-planar surface, planarization has become a requirement. There are a number of planarization techniques, but chem-mech polishing (CMP) has demonstrated superior performance and results and as a consequence, it has become a widely accepted planarization technique for multilevel interconnects. CMP is a surface planarization method in which a wafer is rotated against a polishing pad in the presence of an abrasive and chemically reactive slurry while applying pressure. Among a number of advantages, CMP is perfectly adapted to produce planarized tungsten studs or lands according to the so-called dual damascene process of extensive use to date.

FIG. 1 schematically illustrates a cross-sectional view of a semiconductor structure 10 at five different stages of a classic dual-damascene process. In FIG. 1-1, a P type silicon substrate 11 has different field recess oxide (ROX) regions 12 that are used to isolate the devices formed in the substrate. In FIG. 1-1, only a single NFET 13 is shown for sake of simplicity. NFET 13 includes two diffused regions 14, typically the source and the drain regions, and a doped polysilicon gate electrode 15. Gate electrode 15 is isolated from substrate 11 by a thin dielectric layer 16. Typically, a layer of titanium di-silicide ($TiSi_2$) is deposited on the diffused regions of the NFET 13 to reduce the contact resistance of the ohmic contacts to be subsequently formed therewith. A conductive doped polysilicon land 17 is formed atop a ROX region 12 as shown in the left hand part of FIG. 1-1. Spacers 18 are provided on the sidewalls of gate electrode 15 and polysilicon land 17 and total isolation thereof is achieved by an insulating cap (not shown). Insulating layers of $Si_3N_4$ 19 and borophosphosilicate glass (BPSG) 20 conformally coat the surface of structure 10.

The irregular surface of BPSG layer 20 is then planarized using a conventional CMP step adapted to polish the BPSG material. The structure 10 with a planar main surface 21 is shown in FIG. 1-2. Next, two different sized openings 22 and 23 are etched through $Si_3N_4$ layer 19 and BPSG layer 20 to expose the top portion of polysilicon land 17 and polysilicon gate 15 respectively. Narrow opening 22, comprised of parts 22a and 22b, will be used as a via-hole for an electrical contact, while wide opening 23, comprised of parts 23a and 23b, is designed for receiving a conductive line or conductor. At this stage of the dual damascene process, the resulting structure is shown in FIG. 1-3. To that end, a two-step etch process is used, to ensure that each opening is comprised of these two parts. Then, as illustrated in FIG. 1-4, a titanium nitride (TiN) liner layer 24 and a tungsten layer 25 are conformally deposited in sequence onto the structure 10 top surface, for instance by low pressure chemical vapor deposition (LPCVD). As apparent from FIG. 1-4, the structure 10 surface is bumpy and therefore needs to be planarized again to remove the tungsten material in excess with respect to BPSG layer 20 main surface 21. This operation is also generally achieved by a CMP process. A detailed description of optimized operating conditions of a conventional CMP process for tungsten planarization will be given hereinbelow. The structure at the final stage of the dual damascene process, after tungsten planarization, is shown in FIG. 1-5. The remaining portions of tungsten layer 25 that fill openings 22 and 23 will be referred to as tungsten studs and will bear numerals 26 and 27 respectively. For consistency, stud 26 is comprised of parts 26a and 26b, while stud 27 is comprised of parts 27a and 27b as a result of the dual damascene process. Tungsten studs 26 and 27 form an electrical contact with the top surface of polysilicon land 17 and polysilicon gate 15 respectively. Tungsten studs 26 and 27 represent the M1 level of metallization. As apparent from FIG. 1-5, the width Wb of the upper part 27b of stud 27 is greater than the width Wa of the upper part 26b of stud 26 at the structure 10 surface. This is because part 27b will be used as a conductor as mentioned above, unlike part 26b which will be used as a contact. For convenience, upper parts 26b and 27b will be referred to hereinbelow as the narrow and wide tungsten lands. Unfortunately, at this ultimate stage of the dual damascene process, the surface of structure 10 is not as flat as it should be, but rather irregular as a result of the CMP process for tungsten planarization. As is clear from FIG. 1-5, the structure 10 surface exhibits a typical depression or cusp 28 so that the wide tungsten land 27b is not perfectly coplanar with the main surface 21 of the BPSG layer 20.

There are two causes to that cusp formation. First, the center region of the wafer is etched faster than the edge (or periphery) region and second, the wide tungsten lands (e.g. 27b) are etched faster than the narrow tungsten lands (e.g. 26b) irrespective of their location at the surface of the wafer. The problem is thus more acute for the wide tungsten lands situated at the center of the wafer. This erosion phenomena is referred to in the technical literature as the "dishing" effect. The cusp 28 (FIG. 1-5) produced during the conventional CMP process results from an undesired thinning of the thickness E of the wide tungsten land 27b. The dishing thus reflects an over-polishing of the wide tungsten lands which is detrimental to the sheet resistance thereof. As a matter of fact, the sheet resistance Rs linearly increases as the land thickness E decreases according to equation Rs=$\rho$/E wherein $\rho$ is the tungsten resistivity and may reach values outside the upper limit that is acceptable. The increase of the sheet resistance, in turn causes an increase of the land electrical resistance R which finally may lead to an unacceptable degradation of the overall device/circuit performance. However, over-polishing is necessary because under-polishing would even be a worse case with potential electrical shorts between adjacent wide tungsten lands.

Therefore, the sheet resistance Rs of the wide tungsten lands and more particularly of those located at the center of the wafer, is an essential parameter of the specifications at this stage of the CMP process. If the sheet resistivity is too high, the wafer must be rejected. It is thus highly desired to have the sheet resistance of the wide tungsten lands maintained around the nominal value and it must be less than the acceptable limit given by the specifications to avoid wafer waste. As a consequence, from a production standpoint, the uniformity of the wide tungsten land sheet resistance around the nominal value, wafer to wafer in a same lot, and the reproducibility of this uniformity, lot to lot, are therefore important requirements.

Accordingly, much effort has been directed so far to modify the CMP processes and equipment in a continuous attempt to reduce the dishing effect and its negative impact on the wide tungsten land sheet resistance uniformity, in particular by optimizing the polishing rate. But, because the polishing time is determined by polishing a sample wafer, it significantly varies with a number of process parameters such as the tungsten deposition uniformity, so that the results of the CMP process vary from one wafer to another even in a same lot. As a result, in the case of tungsten planarization with a conventional CMP process, the tolerance (so-called the process window) on the polishing time is close to zero. The wafers are either under-polished (thus they require a new CMP pass to avoid the potential shorts between lands mentioned above) or over-polished which may cause a sheet resistance increase and in turn lead to the rejection of the wafer. The nominal sheet resistance value is very seldom attained on an uniform basis.

The experimental results given below illustrate the consequences of the dishing effect with a conventional CMP process. The wafers to be polished include the structure 10 of FIG. 1 wherein the BPSG layer 20 has a nominal thickness of 2000 nm and the tungsten layer 25 has a nominal thickness of 1600 nm (final thickness E remaining in land 27b: 1100 nm). The aim is to have a land 27b with a sheet resistance Rs of about 0.12 ohms/sq, the upper acceptable limit being of about 0.20 ohms/sq. The wafers were polished with a slurry consisting of alumina ($Al_2O_3$) and ferric nitrate ($Fe_2(NO_3)_3$) diluted in de-ionized (DI) water. The table/carrier speed ratio which is a key parameter of the CMP process was selected as 25/75 rpm as the best compromise for an optimized process. Nine lots of 25 wafers were processed according to the following operating conditions. The polishing time was determined using a sample wafer of the lot.

The conventional CMP process described below is in reality comprised of a preliminary step and a main step.
Preliminary step (slurry: $Al_2O_3/Fe_2(NO_3)_3$/DI water)
(1) Table/carrier speed: 25/75 rpm
(2) Backside air: 1 psi
(3) Arm oscillation: 10 mm
(4) Oscillation speed: 10 mm/min
(5) Slurry flow rate: 300 cc/min
(6) Polish pressure: 2 psi
(7) Pad temperature: 20±5° C.
(8) Polishing time: 5 s
Main step (slurry: $Al_2O_3/F_e2(NO_3)_3$/DI water)
(1) Table/carrier speed: 25/75 rpm
(2) Backside air: 3 psi
(3) Arm oscillation: 10 mm
(4) Oscillation speed: 10 mm/min
(5) Slurry flow rate: 100 cc/min
(6) Polish pressure: 3.5 psi
(7) Pad temperature: 20±5° C.
(8) Polishing time: 600 s FIG. 2 provides a physical representation of the thinning of a wide tungsten land 27b having a width Wb equal to 600 μm caused by the dishing effect when measured with a profilometer for a wafer randomly selected among the nine lots. A profilometer allows an indirect measure of the dishing effect through a simple electrical resistance measurement. This measurement is based on equation $R=\rho \cdot L/S$ wherein $\rho$ is the tungsten resistivity, L and S are respectively the length and the section of the tungsten land 27b, because section S is a function of the land thickness E subject to thinning. Model DEKTAK sold by SLOAN TECHNOLOGY Corp., Santa Barbara, Calif., U.S.A. is adequate in all respects. As apparent from curve 29 in FIG. 2 which illustrates the depression 28 of FIG. 1-5, the thinning is not negligible in the center of the tungsten land 27b. In this particular case of this selected wafer, the height H of the depression is approximately equal to 350 nm. This value has to be compared with the thickness of 1100 nm of tungsten land 27b. More generally, from a number of experiments, it was observed that this height was varying between 350 and 550 nm.

In FIG. 3, curves 30 and 31 show the extreme variations of the average tungsten sheet resistance Rs of a few wide tungsten lands situated at different locations on the wafer (center/edge) for each wafer of these nine lots. The nominal value given by the specifications is equal to 0.12 ohms/sq. These sheet resistance variations between wafers of a same lot and between wafers of different lots are clearly not acceptable in the manufacture of advanced ICs. As apparent from FIG. 3, except for lots bearing numbers 7 and 9, all other runs have some wafers whose sheet resistance is above the upper limit given by the specifications which is 0.20 ohms/sq in this case. These wafers must be rejected which has a non-negligible cost.

In essence, although CMP is the most commonly polishing technique used today for planarizing semiconductor wafers at the final stage of the dual damascene process, the sheet resistance non uniformity of the wide tungsten lands at the center of the wafer, wafer to wafer and lot to lot (i.e. the reproducibility), remains a major concern.

SUMMARY OF THE INVENTION

It is therefore an object of the present invention to provide an improved CMP method for planarizing topographical features, such as metal lands, in multilevel metallized semiconductor chips.

It is another object to provide an improved CMP method for making tungsten lands coplanar with the dielectric layer in a dual-damascene process wherein the dishing effect in wide lands is substantially reduced.

It is yet another object to provide such a method wherein the tolerance on the polishing time (process window) is no longer a problem.

It is still further another object to provide for improved wide tungsten land sheet resistance uniformity (wafer to wafer in a lot) and reproducibility (lot to lot).

In accordance with the above listed and other objects, the dishing effect is reduced by conducting standard polishing, i.e. using the specified operating conditions of the conventional CMP process in consideration, except in that, in this first step, the polishing time is reduced in such extent to avoid any overpolishing. Then, an additional CMP step is performed that aims to polish the periphery of the wafer much faster than the center. During this additional step, the operating conditions of the first step are substantially maintained, except that the flow of polishing slurry is replaced by a flow of de-ionized water. The duration of this additional step depends upon the quantity of tungsten residues that remain after the first step mentioned above, and is thus determined experimentally for each type of product. The unpolished residues of tungsten that remain at the periphery of the wafer after the first step are removed during the second step while the tungsten at the center of the wafer is substantially unaffected, thereby limiting the dishing effect. The method of the present invention finds extensive usage in the planarization of multilevel metallized semiconductor structures, and in particular, it is perfectly adapted to make tungsten lands coplanar with the dielectric layer in a dual damascene process with high uniformity of the wide tungsten land sheet resistance wafer to wafer in a lot and reproducibility of this uniformity from lot to lot.

DESCRIPTION OF THE PREFERRED EMBODIMENTS

Figure 1:
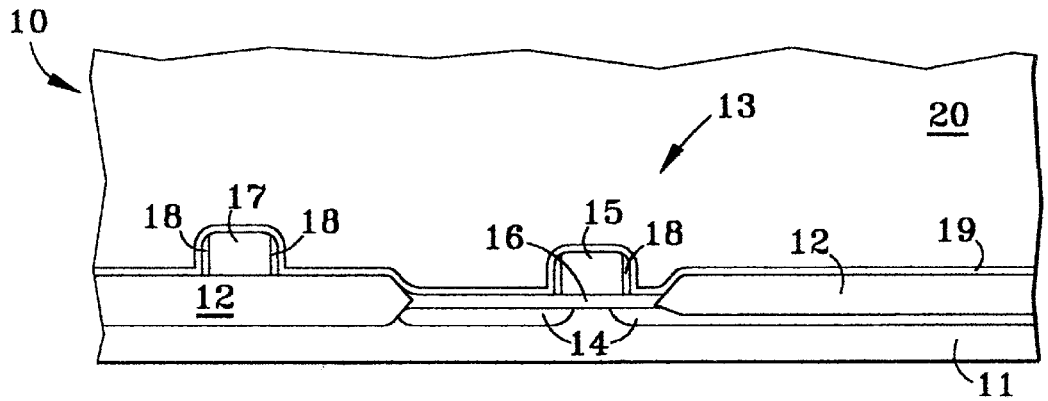
FIG. 1 which is comprised of FIGS. 1-1 to 1-5 illustrates a conventional dual damascene process at five different stages thereof.
Figures 1, 2:
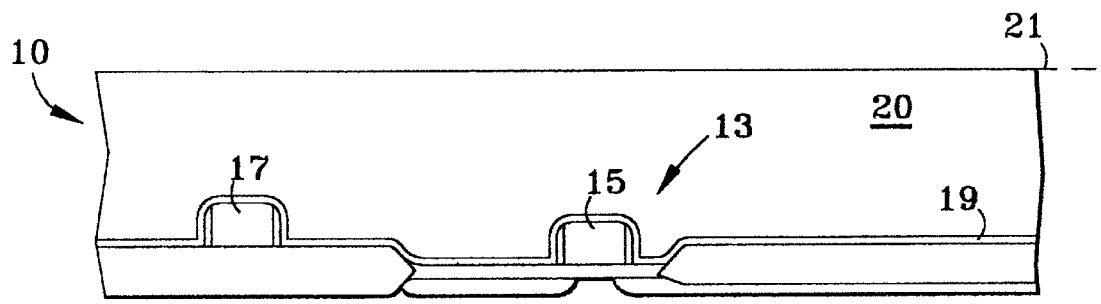
FIG. 2 is a plot generated by a profilometer giving the physical representation of the thinning caused to a wide tungsten land at the center of a wafer selected at random in a lot by a conventional CMP process.
Figures 1, 2, 3:
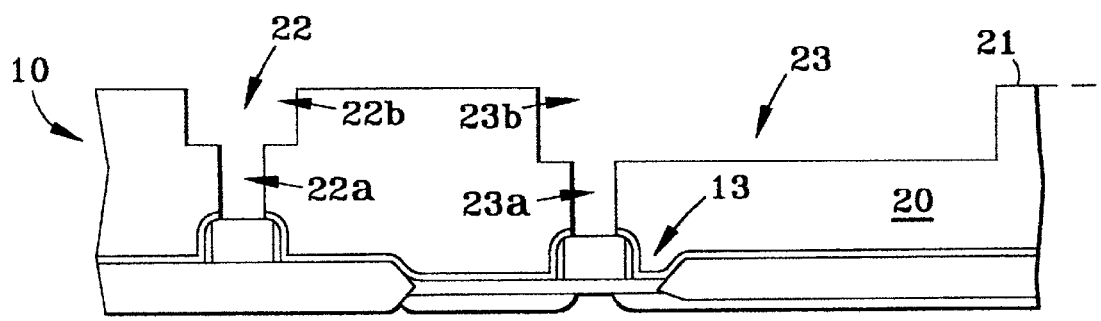
FIG. 3 is a plot showing the variations of the average sheet resistance of wide tungsten lands around the nominal value of 0.12 ohms/sq for nine lots of 25 wafers when the conventional CMP process is used.

The structure of FIG. 1-4 will now be planarized according to the method of the present invention. It is to be noted that the improved CMP method of the present invention is an in-line process fully compatible with any known semiconductor manufacturing process, for example the damascene or dual-damascene type. The present invention is not restricted to the damascene or dual-damascene process, and also not restricted to polishing of metal.

First, the wafers are polished with slurry under the selected operating conditions except in that the polishing time is reduced in order to avoid any overpolishing of the wide tungsten lands. Then, in an additional step, the selected operating conditions are maintained except that a flow of deionized (DI) water now replaces the flow of slurry. It has been observed by the inventor that this additional step at the end of the standard CMP process allows to continue the polishing (although at a lower rate) of the wide tungsten lands situated at the periphery of the wafer with the slurry (which still impregnates the pad). On the contrary, the removal of the tungsten of the wide lands situated at the center of the wafer is substantially reduced because the slurry which impregnates the pad becomes more and more diluted by the flow of incoming DI water. During the additional step, the polishing is thus less efficient in the center of the wafer than at the periphery. In other words, there is a kind of a self-limitation to the polishing in the center of the wafer caused by the flow of de-ionized water in lieu of the slurry which causes the dishing effect.

The duration of this additional step is determined experimentally on a sample product to take in account the residues of tungsten material not completely removed in the first step. The same polisher, pad, and slurry used before were used here for consistency.

Preliminary step (slurry: $Al_2O_3/Fe_2(NO_3)_3/DI$ water)
(1) Table/carrier speed: 25/75 rpm
(2) Backside air: 1 psi
(3) Arm oscillation: 10 mm
(4) Oscillation speed: 10 mm/min
(5) Slurry flow rate: 300 cc/min
(6) Polish pressure: 2 psi
(7) Pad temperature: 20±5° C.
(8) Polishing time: 5 sec Main step (slurry: $Al_2O_3/Fe_2(NO_3)_3/DI$ water)
(1) Table/carrier speed: 25/75 rpm
(2) Backside air: 3 psi
(3) Arm oscillation: 10 mm
(4) Oscillation speed: 10 mm/min
(5) Slurry flow rate: 100 cc/min
(6) Polish pressure: 3.5 psi
(7) Pad temperature: 20±5° C.
(8) Polishing time: 540 sec As apparent from the above, with regards to the conventional CMP process described above in the prior art section, the same operating conditions are maintained, except the polishing time has been reduced from 600 seconds to 540 seconds to avoid any overpolishing at the center of the wafer. As a consequence, at this stage of the process, some unpolished tungsten material remains at the periphery of the wafer. These residues will be now removed with an additional CMP step described below.

Additional step (DI water instead of slurry)
(1) Table carrier speed: 25/75 rpm
(2) Backside air: 3 psi
(3) Arm oscillation: 10 mm
(4) Oscillation speed: 10 mm/min
(5) DI water flow rate: 250 cc/min
(6) Polish pressure: 3.5 psi
(7) Pad temperature: 20±5° C.
(8) Polishing time: 30 sec As far as this additional step is concerned, the operating conditions given above for the main step are the same in all respects, except the flow of slurry is replaced by a flow of de-ionized (DI) water. In the additional step, the polishing time (30 seconds in the present case) depends on the quantity of tungsten residues that can be observed at the surface of the sample wafer. This second polishing time is thus determined experimentally for each type of product.

Figures 1, 2, 3, 4:
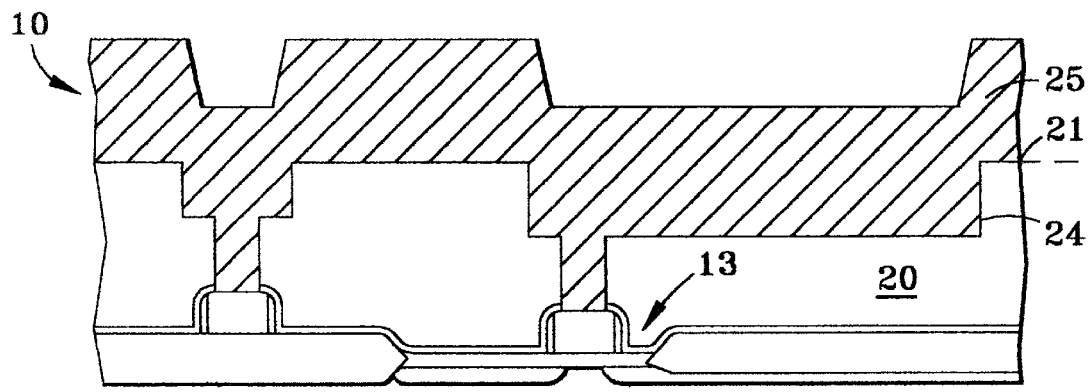
FIG. 4 is a plot generated by a profilometer giving the physical representation of the thinning caused to a wide tungsten land at the center of a wafer selected at random in a lot when the improved CMP method of the present invention is used.

FIG. 4 shows curve 32 that gives a physical representation of the thinning of a wide tungsten land when measured with the DEKTAK profilometer mentioned above. The dishing effect was still measured on a wide tungsten land (e.g. 27b) at the center of the wafer having a width Wb equal to 600 μm. As apparent from curve 32, the thinning is more limited and has now a typical maximum height value H of 120 nm in the center of the wide tungsten land, instead of 350 nm with the conventional CMP process illustrated in FIG. 2. More generally, the measured heights were ranging from 80 to 120 nm with the improved CMP process of the present invention.

Figures 1, 2, 3, 4, 5:
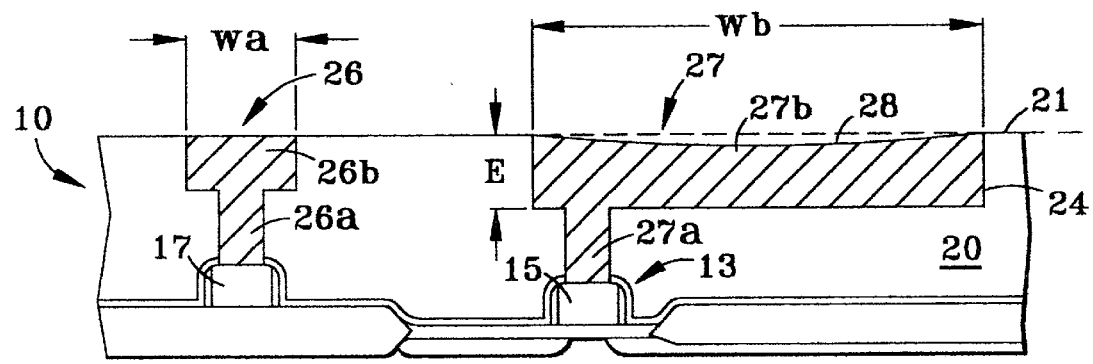
FIG. 5 is a plot showing the variations of the average sheet resistance of wide tungsten lands around the nominal value of 0.12 ohms/sq for 15 lots of 25 wafers when the improved CMP method of the present invention is used in order to demonstrate that a better uniformity and reproducibility have been obtained.
Figure 2:
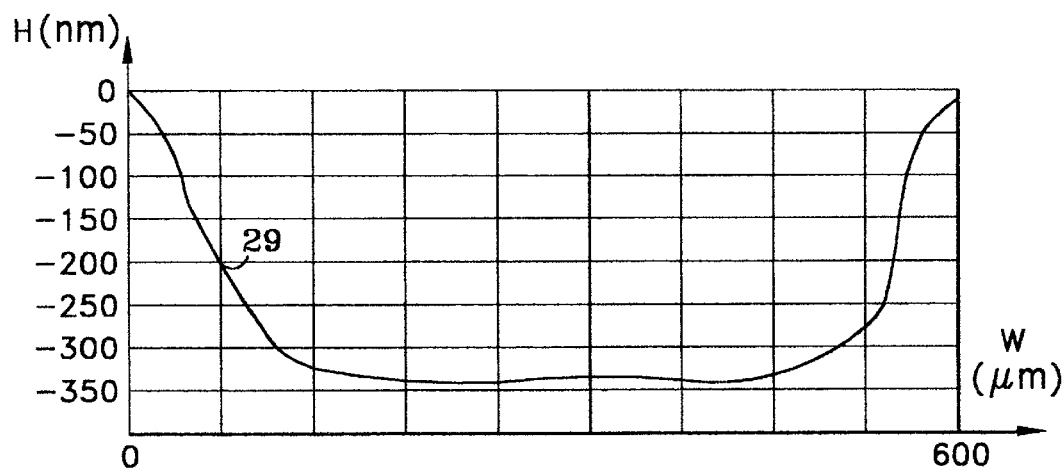
Figure 3:
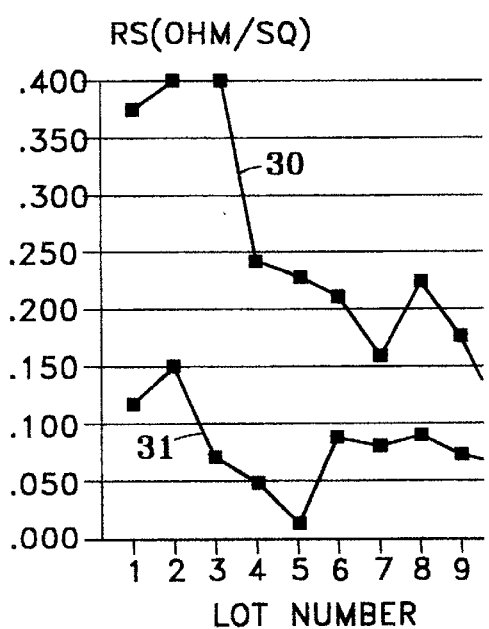
Figure 4:
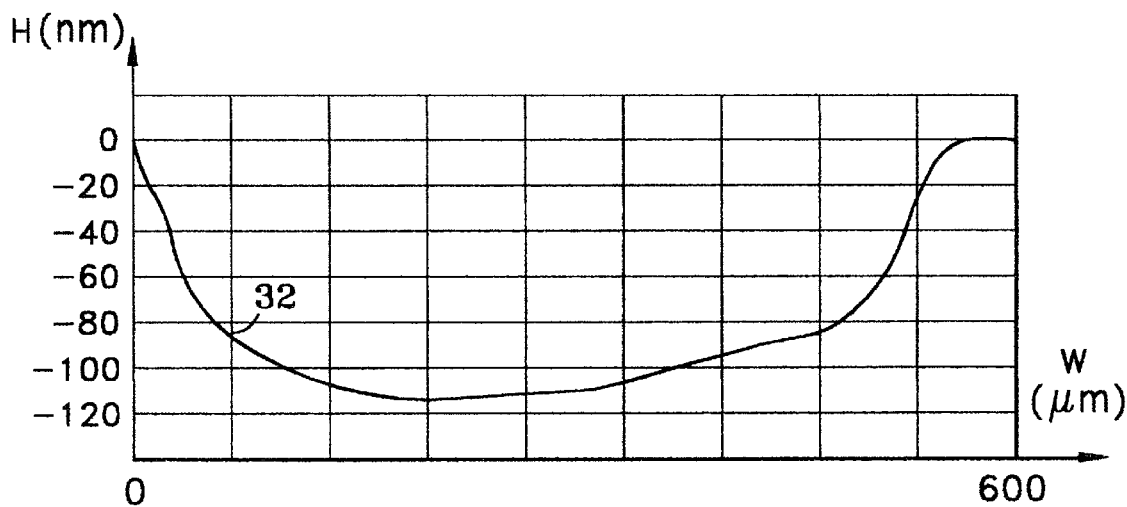
Figure 5:
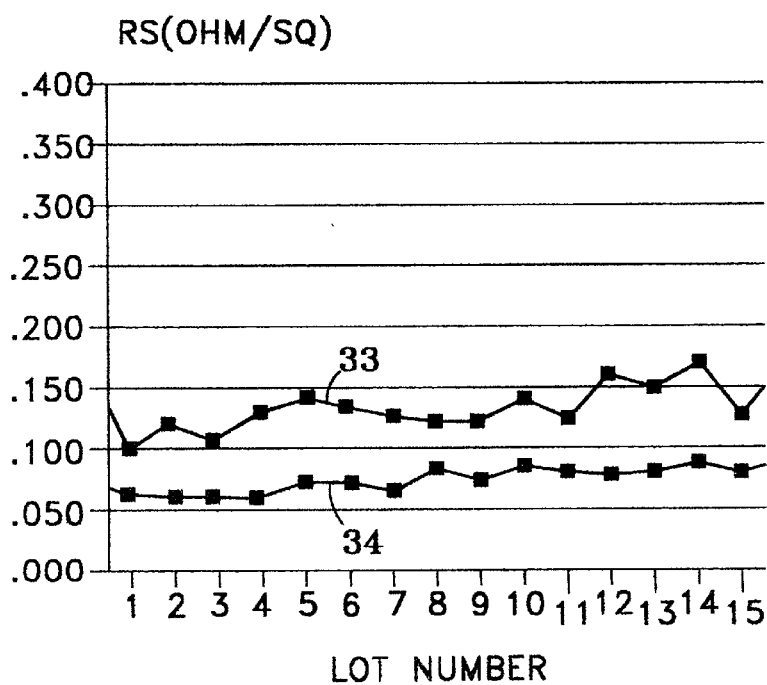

In FIG. 5, curves 33 and 34 show the variations of the average sheet resistivity Rs of a few selected wide tungsten lands for each wafer of these 15 lots processed with the improved CMP method of the present invention. The nominal sheet resistance value is still equal to 0.12 ohms/sq. As apparent from FIG. 5, there is a significant improvement in terms of sheet resistance uniformity wafer to wafer and reproducibility from lot to lot. The variations that can be now noticed are totally acceptable in the manufacture of advanced ICs. Moreover, the tolerance on the polishing time mentioned above from one wafer to another is no longer a problem with the method of the present invention.

It is remarkable to notice that this additional polishing step which is performed with DI water for a short duration while keeping in place the polishing pad that was used during the main step provides unexpected advantages. It finishes the polishing at the periphery of the wafer (at a lower rate) because of the remaining slurry that still impregnates the pad while the polishing at the center of the wafer is significantly reduced because the slurry is diluted by the flow of DI water. As a final result, there is no noticeable overpolishing at the center region of the wafer and thus the dishing effect is quite limited. It is to be also noted, that although the description has been made by reference to the planarization of tungsten lands in a BPSG layer, the present invention also encompasses other metals and other dielectric materials as well.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method of chemical-mechanical polishing a surface of a semiconductor wafer, comprising the steps of:

polishing the wafer with slurry at a first flow rate under selected operating conditions for a first time period that avoids overpolishing; and polishing the wafer with DI water at a second flow rate under said operating conditions for a second time period until the surface of the wafer is substantially planar and dishing is minimized.

2. The method of claim 1 wherein a layer of metal is being polished down to a layer of dielectric.

3. The method of claim 2 wherein the metal is tungsten and the dielectric is BPSG.

4. A method of chemical-mechanical polishing a semiconductor substrate, comprising the steps of:

polishing a semiconductor substrate with a dielectric layer formed thereon having a generally planar main surface with openings formed therein;

filling said openings in excess with a layer of material;

polishing the substrate with slurry at a first flow rate under selected operating conditions for a first time period which avoids overpolishing of the material with respect to the main surface; and polishing the substrate using DI water at a second flow rate under said operating conditions for a second time period to make the material in said openings coplanar with the main surface and minimize dishing.

5. The method of claim 4 wherein the material is a metal.

6. The method of claim 5 wherein said metal is tungsten and said dielectric is BPSG.

* * * * *